United States Patent
Triyoso et al.

(10) Patent No.: US 12,406,887 B2
(45) Date of Patent: Sep. 2, 2025

(54) SELECTIVE FILM FORMATION USING A SELF-ASSEMBLED MONOLAYER

(71) Applicant: Tokyo Electron Limited, Tokyo (JP)

(72) Inventors: Dina H. Triyoso, Albany, NY (US); Lior Huli, Albany, NY (US); Corey Lemley, Troy, NY (US); Robert D. Clark, Livermore, CA (US); Gerrit Leusink, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 596 days.

(21) Appl. No.: 17/854,930

(22) Filed: Jun. 30, 2022

(65) Prior Publication Data
US 2023/0009688 A1 Jan. 12, 2023

Related U.S. Application Data

(60) Provisional application No. 63/218,841, filed on Jul. 6, 2021.

(51) Int. Cl.
*H01L 21/768* (2006.01)
*C23C 16/02* (2006.01)
(Continued)

(52) U.S. Cl.
CPC .. *H01L 21/76897* (2013.01); *H01L 21/02071* (2013.01); *H01L 21/02282* (2013.01);
(Continued)

(58) Field of Classification Search
CPC ............... H01L 21/32; H01L 21/76829; H01L 21/76883; H01L 21/76897; C23C 16/402; C23C 16/02; C23C 16/045
See application file for complete search history.

(56) References Cited

U.S. PATENT DOCUMENTS 7,728,436 B2 6/2010 Whelan et al.
9,837,314 B2 12/2017 Smith et al.
(Continued)

FOREIGN PATENT DOCUMENTS

EP 1670054 A1 6/2006
KR 20210057185 A 5/2021

OTHER PUBLICATIONS

International Searching Authority, "Notification of Transmittal of the International Search Report and the Written Opinion of the International Searching Authority, or the Declaration," International application No. PCT/US2022/035139, Oct. 28, 2022, 13 pages.
(Continued)

*Primary Examiner* — Mohsen Ahmadi
(74) *Attorney, Agent, or Firm* — Slater Matsil, LLP

(57) ABSTRACT

A method of processing a substrate that includes: loading the substrate in a processing system, the substrate including a metal having a metal surface and a first dielectric material having a dielectric material surface, the metal surface and the dielectric material surface being at the same level; etching the metal to form a recessed metal surface below the dielectric material surface; selectively forming a self-assembled monolayer (SAM) on the recessed metal surface using a spin-on process; and depositing a dielectric film including a second dielectric material on the dielectric material surface.

20 Claims, 8 Drawing Sheets

(51) Int. Cl.
   *C23C 16/04* (2006.01)
   *C23C 16/40* (2006.01)
   *H01L 21/02* (2006.01)
   *H01L 21/32* (2006.01)
   *H01L 21/321* (2006.01)
   *H01L 21/3213* (2006.01)
   *H01L 21/687* (2006.01)

(52) U.S. Cl.
   CPC .... *H01L 21/3212* (2013.01); *H01L 21/32134* (2013.01); *H01L 21/68764* (2013.01); *H01L 21/76834* (2013.01); *H01L 2221/1063* (2013.01)

(56) References Cited

U.S. PATENT DOCUMENTS

| | | | |
|---|---|---|---|
| 10,068,764 | B2 | 9/2018 | Tapily et al. |
| 2003/0089891 | A1* | 5/2003 | Andreas .............. C11D 3/48 134/28 |
| 2003/0134510 | A1* | 7/2003 | Lee .............. H01L 23/53238 257/E21.585 |
| 2003/0207560 | A1* | 11/2003 | Dubin .............. H01L 21/76879 257/E21.174 |
| 2003/0216057 | A1* | 11/2003 | Hussein .......... H01L 21/76808 257/E21.579 |
| 2005/0020058 | A1 | 1/2005 | Gracias et al. |
| 2006/0108320 | A1 | 5/2006 | Lazovsky et al. |
| 2006/0246699 | A1* | 11/2006 | Weidman ........ H01L 21/76831 257/E21.174 |
| 2007/0082457 | A1 | 4/2007 | Chou et al. |
| 2014/0084272 | A1 | 3/2014 | Fleissner et al. |
| 2018/0076027 | A1* | 3/2018 | Tapily .............. H01L 21/76829 |
| 2018/0323102 | A1 | 11/2018 | Redzheb et al. |
| 2019/0157149 | A1* | 5/2019 | Tapily .............. H01L 21/02214 |
| 2019/0295891 | A1 | 9/2019 | Clark et al. |
| 2019/0295903 | A1* | 9/2019 | Clark .............. H01L 21/02636 |
| 2019/0391494 | A1 | 12/2019 | Wojtecki et al. |
| 2020/0118871 | A1 | 4/2020 | Yu et al. |
| 2021/0175118 | A1 | 6/2021 | Negreira et al. |

OTHER PUBLICATIONS

Casalini et al., "Self-assembled monolayers in organic electronics," The Royal Society of Chemistry 2017,46, pp. 40-71, Received Jul. 6, 2016, DOI: 10.1039/c6cs00509h, 33 pages.

Chabinyc et al., "Organic polymeric thin-film transistors fabricated by selective dewetting," Applied Physics Letters, vol. 81, No. 22, Nov. 25, 2002, https://doi.org/10.1063/1.1524301, 4 pages.

Gentili et al., "Applications of Dewetting in Micro and Nanotechnology," Chemical Society Reviews—Apr. 2012, vol. 41, pp. 4430-4443, https://www.researchgate.net/publication/223972807, 15 pages.

Whitesides et al., "Molecular engineering of surfaces using self-assembled monolayers," Science Progress (2005), 88 ( I ), published Feb. 1, 2005, pp. 17-48, www.scilet.com, 31 pages.

Zhang et al., "Selective spin-on deposition of polymers on heterogeneous surfaces," Proceedings vol. 10960, Advances in Patterning Materials and Processes XXXVI; 109600Q (2019) https://doi.org/10.1117/12.2515666, Mar. 25, 2019, 10 pages.

\* cited by examiner

SELECTIVE FILM FORMATION USING A SELF-ASSEMBLED MONOLAYER

CROSS-REFERENCE TO RELATED APPLICATIONS

This application claims the benefit of U.S. Provisional Application No. 63/218,841, filed on Jul. 6, 2021, which application is hereby incorporated herein by reference.

TECHNICAL FIELD

The present invention relates to semiconductor processing and semiconductor processing systems, and more particularly, to a method for selective film formation using a self-assembled monolayer (SAM) in semiconductor manufacturing.

BACKGROUND

Semiconductor devices typically are fabricated by sequentially depositing insulating or dielectric layers, conductive layers, and other layers of material over a semiconductor substrate, and patterning the various layers using lithography to form circuit components and elements on the semiconductor substrate. The semiconductor industry continues to increase the density of electronic components (e.g., transistors, diodes, resistors, capacitors, etc.) by continual reductions in minimum feature size, allowing more components to be integrated into a particular area.

As scaling of semiconductor devices continues to smaller and smaller features, manufacturing steps become more complex and issues such as voids and edge placement errors arise. The use of selective film deposition processes is becoming more critical to simplify manufacturing steps and provide more process margins that translate into higher yield.

SUMMARY

In accordance with an embodiments of the present invention, a method of processing a substrate that includes: loading the substrate in a processing system, the substrate including a metal having a metal surface and a first dielectric material having a dielectric material surface, the metal surface and the dielectric material surface being at the same level; etching the metal to form a recessed metal surface below the dielectric material surface; selectively forming a self-assembled monolayer (SAM) on the recessed metal surface using a spin-on process; and depositing a dielectric film including a second dielectric material on the dielectric material surface.

In accordance with an embodiments of the present invention, a method of processing a substrate that includes: planarizing a surface of the substrate, the substrate including a first material and a second material, the planarizing exposing a first region including the first material and a second region including the second material; selectively etching the first region to form a recess, the recess having an etched surface at a lower level than the second region of the planarized surface; selectively forming a self-assembled monolayer (SAM) on the etched surface of the first region using a spin-on process; and depositing a dielectric film on the second region of the planarized surface.

In accordance with an embodiments of the present invention, a method of processing a substrate that includes: forming a first plurality of recesses in a dielectric layer of the substrate, the dielectric layer including a first dielectric material; conformally depositing a barrier layer within the plurality of recesses; depositing a metal over the barrier layer to fill the first plurality of recesses; planarizing a top surface of the substrate, the planarized surface including the first dielectric material, the barrier layer, and the metal; selectively etching the metal to form an etched surface at a lower level than a remaining region of the planarized surface; selectively forming a self-assembled monolayer (SAM) on the etched surface using a spin-on process; and depositing a dielectric film on the remaining region of the planarized surface.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A-3E illustrate, through schematic cross-sectional views of a substrate, a method of processing the substrate in accordance with various embodiments, wherein FIG. 3A illustrates the incoming substrate having a metal surface and a dielectric material surface, FIG. 3B illustrates the substrate after selectively etching the metal to form a recessed metal surface, FIG. 3C illustrates the substrate after selectively forming a self-assembled monolayer (SAM) on the recessed metal surface, FIG. 3D illustrates the substrate after depositing a dielectric film on the dielectric material surface, where the SAM hinders deposition of the dielectric film on the recessed metal surface, and FIG. 3E illustrates the substrate after removing the SAM; and FIG. 4A-4D illustrate example process flow diagrams in accordance with various embodiments, wherein FIG. 4A illustrates an embodiment, FIG. 4B illustrates steps for selectively forming a SAM on a recessed metal surface in accordance with an embodiment, FIG. 4C illustrates another embodiment, and FIG. 4D illustrates yet another embodiment.

DETAILED DESCRIPTION OF ILLUSTRATIVE EMBODIMENTS

This application relates to a method of processing a substrate, more particularly to selective film formation using a self-assembled monolayer (SAM) in semiconductor manufacturing. As the scaling of advanced semiconductor devices and manufacturing methods thereof continues, selective deposition is needed to simplify manufacturing steps and provide more process margin which could translate to higher yield. In various selective deposition process flows, SAM may be used as blocking layer. In particular, the SAM formed by a spin-on process (i.e., spin on SAM) is a cost effective blocking layer. For example, in case of dielectric on dielectric (DoD) selective deposition process useful for logic and memory applications, the SAM coated surface prevents the dielectric deposition and thereby enables the dielectric to be deposited only on the surface not coated with the SAM. However, it is still very challenging to achieve sufficient selectivity on narrow space (e.g., <30 nm). Therefore, a new cost effective method for selective SAM formation may be desired. Embodiments of the present application disclose methods of selective deposition on small spaces with spin on SAM.

The methods described in this disclosure may advantageously enables the selective SAM formation, particularly in narrow spaces such as <30 nm pitch size features. Various embodiments utilize a simple metal etch step to form a recessed metal surface. The inventors identified that this formed recess may improve the selectivity of the subsequent SAM formation step, limiting the SAM to be deposited only on the recessed metal surface. With the methods of the selective SAM formation, current dielectric on dielectric (DoD) processes may be further improved and may, for example, enable a bottom up fill process, reduce chemical mechanical planarization (CMP) overburden, allow a smaller starting stack height, and increase overall margin and yield.

In the following, an example spin-coating processing system for selective self-assembled monolayer (SAM) formation is first described referring to FIG. 1 in accordance with an embodiment. A simplified structure of a SAM molecule is illustrated in FIG. 2. In FIG. 3A-3E, a method of selective SAM formation and dielectric deposition is described in accordance with various embodiments. Example process flow diagrams are illustrated in FIG. 4A-4D. All figures in this disclosure are drawn for illustration purpose only and not to scale, including the aspect ratios of features.

Figure 1:
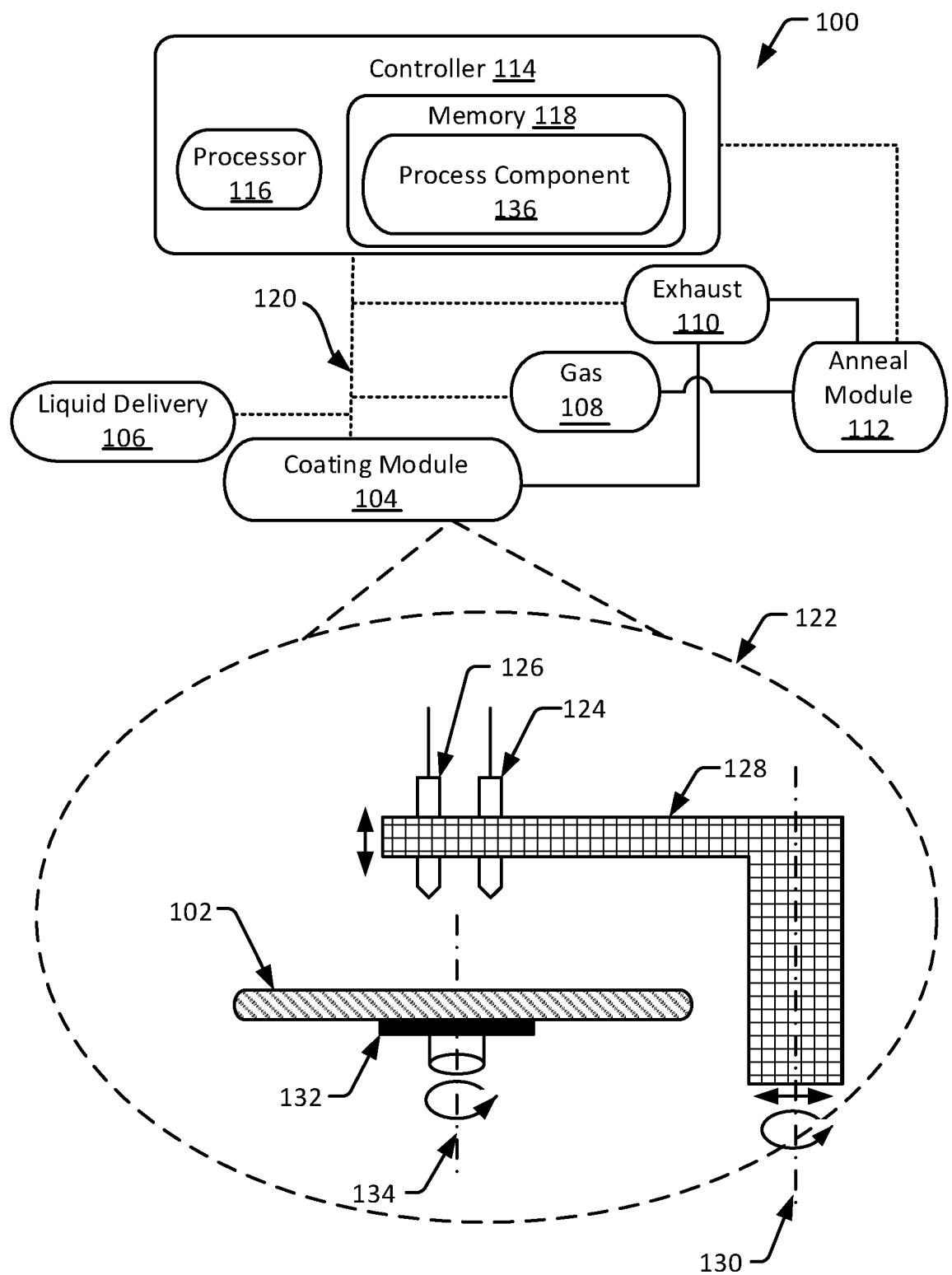
FIG. 1 illustrates a representative embodiment of a spin-coating processing system that includes a cross-sectional illustration of a coating module of the spin-coating processing system.
Figure 2:
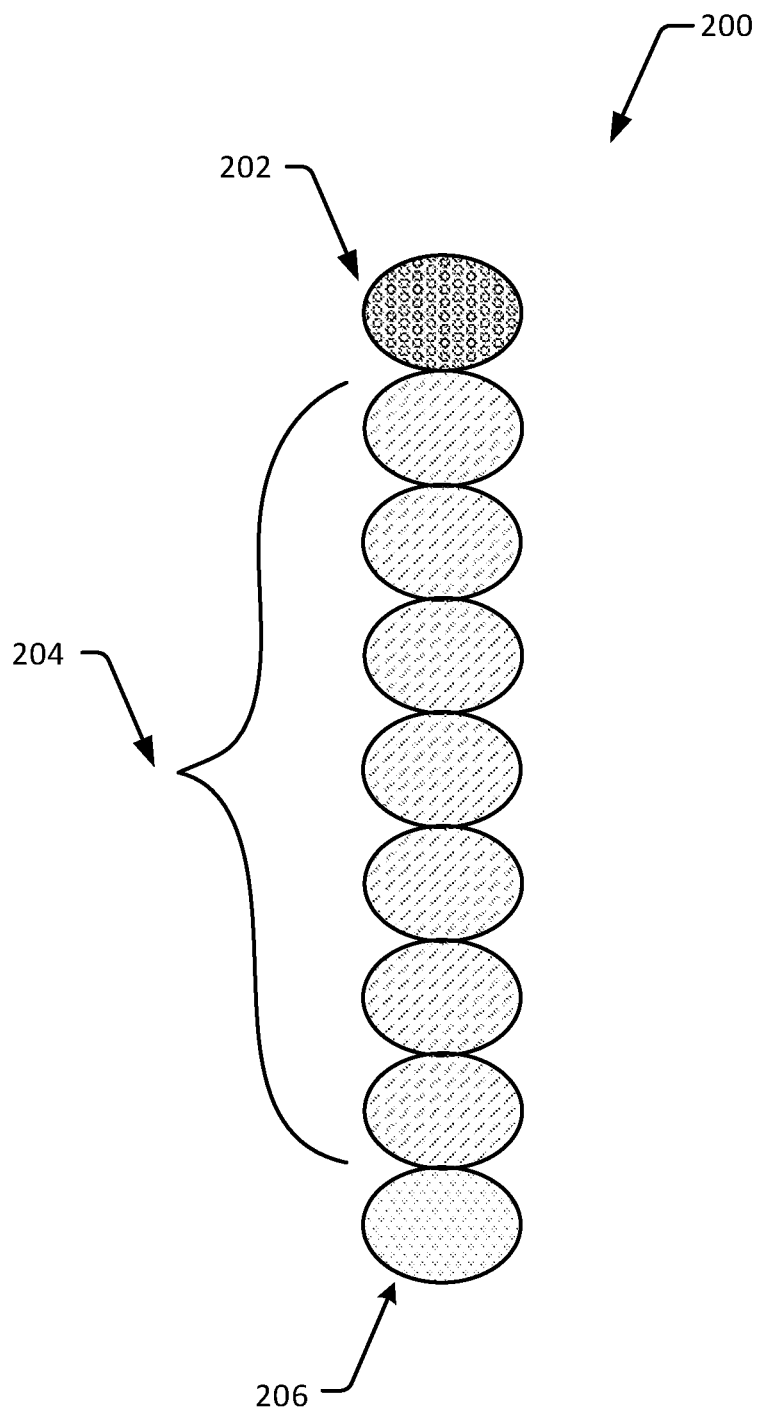
FIG. 2 illustrates a representative embodiment of a group of a self-assembled monolayer (SAM)

FIG. 1 illustrates a representative embodiment of a spin-coating processing system that includes a cross-sectional illustration of a coating module of the spin-coating processing system.

FIG. 1 depicts a spin-coating processing system 100 for dispensing chemicals onto a substrate 102 using a coating module 104 that is in fluid communication with a liquid delivery system 106 that may dispense one or more types of liquid chemicals. The system 100 may also include a gas delivery system 108 that may provide gas to the coating module 104 that may be removed via an exhaust system no. A liquid drain (not shown) may also be incorporated into the exhaust system to remove liquids from the coating module 104. The system 100 may also include an anneal module 112 that may bake or apply light radiation to the substrate 102 after the chemicals have been dispensed. A controller 114 may be used control the components of the system 100 using an electrical communication network that may send or receive computer-executable instructions or electrical signals between the system 100 components. The controller 114 may include one or more computer processors 116 and memory 118 that may store computer-executable instructions that may be executed by the computer processors or other logic/processing devices. The controller 114 may store process component 136 than can include a recipe or process condition routines that may be implemented by controlling or directing the components of the system 100 to obtain certain conditions within the coating module 104 and/or the anneal module 112. Communication between the components may be implemented through processing and electrical communication techniques known to a person of ordinary skill in the art, as represented by the dashed lines 120.

The computer processors 116 may include one or more processing cores and are configured to access and execute (at least in part) computer-readable instructions stored in the one or more memories. The one or more computer processors 116 may include, without limitation: a central processing unit (CPU), a digital signal processor (DSP), a reduced instruction set computer (RISC), a complex instruction set computer (CISC), a microprocessor, a microcontroller, a field programmable gate array (FPGA), or any combination thereof. The computer processors 116 may also include a chipset(s) (not shown) for controlling communications between the components of the system 100. In certain embodiments, the computer processors may be based on Intel™ architecture or ARM™ architecture and the processor(s) and chipset may be from a family of Intel™ processors and chipsets. The one or more computer processors may also include one or more application-specific integrated circuits (ASICs) or application-specific standard products (ASSPs) for handling specific data processing functions or tasks.

The memory 118 may include one or more non-transitory computer-readable storage media ("CRSM"). In some embodiments, the one or more memories may include non-transitory media such as random access memory ("RAM"), flash RAM, magnetic media, optical media, solid state media, and so forth. The one or more memories may be volatile (in that information is retained while providing power) or non-volatile (in that information is retained without providing power). Additional embodiments may also be provided as a computer program product including a non-transitory machine-readable signal (in compressed or uncompressed form). Examples of machine-readable signals include, but are not limited to, signals carried by the Internet or other networks. For example, distribution of software via the Internet may include a non-transitory machine-readable signal. Additionally, the memory may store an operating system that includes a plurality of computer-executable instructions that may be implemented by the processor to perform a variety of tasks to operate the system 100.

FIG. 1 also includes a representative illustration 122 of one embodiment of the coating module 104 that may dispense chemicals onto the substrate 102. The system 100 may be used to dispense one or more liquid chemicals that may be distributed across the substrate 102 be either rotating the substrate 102, translating the substrate 102, or rotating or translating the locations of the liquid dispensers. The liquid dispensers 124, 126, may disposed above the substrate 102 may be moved across or around to any position above or adjacent to the substrate 102 using the positioning mechanism 128. In the embodiment in FIG. 1, the positioning mechanism 128 may move forward and backward in a horizontal and/or vertical plane as indicated by the arrows adjacent to the positioning mechanism 128. The positioning mechanism 128 may also be rotated around the vertical axis 130 of the positioning mechanism 128. The positioning mechanism 128 may dispense chemicals at discrete locations around the substrate 102 or they may be dispensed as the positioning mechanism 128 moves across the substrate 102. The chemicals may be disposed in a continuous or non-continuous manner onto the substrate. The chemicals may be dispensed one at a time in several movements across the substrate 102 or the chemicals may be dispensed at the same location, but at different times.

The substrate 102 may be secured to a rotating chuck 132 that supports the substrate 102 and may rotate the substrate 102 during the chemical dispensing. The substrate 102 may be rotated around the rotation axis 134 with up to speeds of 2200 revolutions per minute (rpm). The chemical dispense may occur before, during, and/or after the substrate 102 starts to rotate.

Prior to or after the chemical dispensing, the substrate 102 may be treated in the anneal module 112 that may heat the substrate 102 up to remove moisture from the substrate 102 prior to the chemical dispensing or to treat the film deposited on the substrate 102 by the coating module 104. The anneal module 112 may include, but is not limited to, a resistive heating element (not shown) that transfers heat via conduction to the substrate 102. In another embodiment, the anneal module 112 may include a radiation source (not shown) that exposes the substrate 102 to radiation. The radiation source may include, but is not limited to, an ultraviolet light (UV) source (not shown). The anneal module 112 may also heat the substrate 102 via convection by receiving heated gas from the gas delivery system 108. The anneal module 112 may also treat the substrate 102 with relatively inert gases, with respect to the substrate 102 or deposited film, to prevent chemical reactions with the ambient or surrounding environment (e.g., oxygen, moisture, etc.). The gases may also be used to remove gas or fluid that is out-gassed from the deposited film during the anneal treatment. The out-gassed chemicals may be removed by the exhaust system no that that removes the gases from the anneal module 112.

FIG. 2 illustrates a representative embodiment of a group of a self-assembled monolayer (SAM).

FIG. 2 is an illustration of a representative embodiment of a group of a self-assembled monolayer (SAM) molecule 200 that may be formed on the substrate 102. SAMs are widely known as surface modification agents and adhesion layers. The SAM molecule 200 shown in FIG. 2 is intended for illustrative purposes to explain the components of the SAM. In application, the SAM molecule 200 may be used with a plurality of SAM molecules 200 that arrange themselves in a systematic manner on the substrate 102. In brief, the plurality of SAM molecules 200 may form a three-dimensional crystalline or semi-crystalline structure on the surface of the substrate 102. The SAM molecule 200 may have a thickness of less than 1 nm. The SAM molecule 200 may include a chemical compound that includes a terminal group 202, a chain group 204, and bonding group 206. These groups may form the building blocks of the SAM molecule 200 and that the interactions between these groups and the substrate 102 may form a three-dimensional structure. The molecular self-assembly may due to a combination of van der Waals interactions, hydrophobic interactions, and/or molecule-substrate interactions that form highly ordered low-dimensional structures spontaneously on the substrate 102 or overlying films (not shown).

Broadly, the bonding group 206 may be coupled to or chemisorbed to the substrate 102. The bonding group 206 may be chemically attracted to the substrate 102 or to a film or layer on the substrate 102, such as a metal layer. However, the terminal group 202 and the chain group 204 may be not be coupled to or chemisorbed into the substrate 102, or at least not coupled in the same way as the bonding group 206. The chain group 204 and the terminal group 202 may assemble themselves as shown in FIG. 2. As a result of this selective assembly, the SAM molecule 200 may appear to stand on end with the bonding group 206 secured to the substrate 102 and the terminal group 202 and chain group 206 being tethered to the substrate 102 via the bonding group 206.

The SAM molecule 200 may be used for a variety of applications and the composition of the groups, or building blocks, may vary depending on the desired structure and the type of substrate 102. According to one embodiment, the bonding group 206 may be any reactive element that can bond or chemically react with a desired material layer on the substrate 102, for example a metal layer, and only weakly bond to a different material, for example a dielectric material. In case of a metal layer, in some examples, the bonding group 206 can include a thiol, a silane, a carboxylate, or a phosphonate. The chain group 204 may include a chain of carbon elements that are may be connected or bonded together. Although FIG. 2 illustrates one group of the SAM molecule 200, the chain group 204 may be bonded with adjacent chain groups that may form the larger SAM structure (not shown). In various embodiments, the chain group 204 may include $C_xH_y$ molecules that may be bonded together to form the three-dimensional structure of the SAM molecule 200 across the surface of the substrate 102. The terminal group 202 may be assembled above the chain group 204 and may be selected based on the application of the SAM molecule 200. Examples of the SAM molecule 200 include, but are not limited to, i-octadecanethiol ($CH_3(CH_2)_{16}CH_2SH$), perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), and tertbutyl(chloro)dimethylsilane (($CH_3)_3CSi(Cl)(CH_3)_2$)).

FIGS. 3A-3E illustrate, through schematic cross-sectional views of a substrate, a method of processing the substrate in accordance with various embodiments.

Figure 3A:
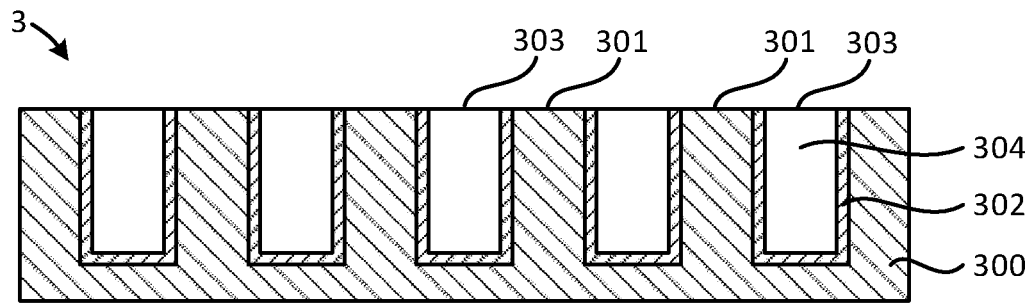

In FIG. 3A, a substrate 3 may be a part of, or include, a semiconductor device, and may have undergone a number of steps of processing following, for example, a conventional process. The substrate 3 accordingly may comprise layers of semiconductors useful in various microelectronics. For example, the semiconductor structure may comprise the substrate 3 in which various device regions are formed.

In one or more embodiments, the substrate 3 may be a silicon wafer, or a silicon-on-insulator (SOI) wafer. In certain embodiments, the substrate 3 may comprise a silicon germanium wafer, silicon carbide wafer, gallium arsenide wafer, gallium nitride wafer and other compound semiconductors. In other embodiments, the substrate 3 comprises heterogeneous layers such as silicon germanium on silicon, gallium nitride on silicon, silicon carbon on silicon, as well layers of silicon on a silicon or SOI substrate. In various embodiments, the substrate 3 is patterned or embedded in other components of the semiconductor device.

As illustrated in FIG. 3A, the substrate 3 may be patterned and contains recessed features in a dielectric material 300, where the recessed features contain a barrier/liner layer 302 that surrounds a metal 304 on the sidewall and the bottom of the recessed features. The substrate 3 includes an exposed metal surface 303 and an exposed dielectric material surface 301. In addition, the surface of the substrate may also comprise exposed edges of the barrier/line layer 302 as illustrated in FIG. 3A. In one example, the metal 304 and the metal surface 303 can include a metal selected from the group consisting of Cu, Al, Ta, Ti, W, Ru, Co, Ni, and Mo. In one or more embodiments, the metal 304 may comprise more than one metals. In one example, the dielectric material surface includes silicon. In another example, the dielectric material surface includes $SiO_2$ or a low-k material. In various embodiments, the barrier/liner layer 302 may include tantalum (Ta)-based materials, Ru, Co or silicon nitride (SiN)-based materials. In various embodiments, the recessed features may be used for forming a fully self-aligned via (FSAV). Accordingly, in certain embodiments, the recessed features may have a pitch size of 30 nm or less. At such narrow space conventional selective deposition may suffer insufficient selectivity. Therefore, the methods of selective SAM formation disclosed in this application may be particularly advantageous in such small scales, although the methods are applicable at any scale of features.

In various embodiments, the exemplary substrate 3 may have been planarized with the metal surface 303 and the dielectric material surface 301 in the same horizontal plane. In certain embodiments, the planarization may utilize a chemical mechanical planarization (CMP) process, followed by a cleaning process to remove any impurities and oxidation from the surfaces of the substrate 3.

Figure 3B:
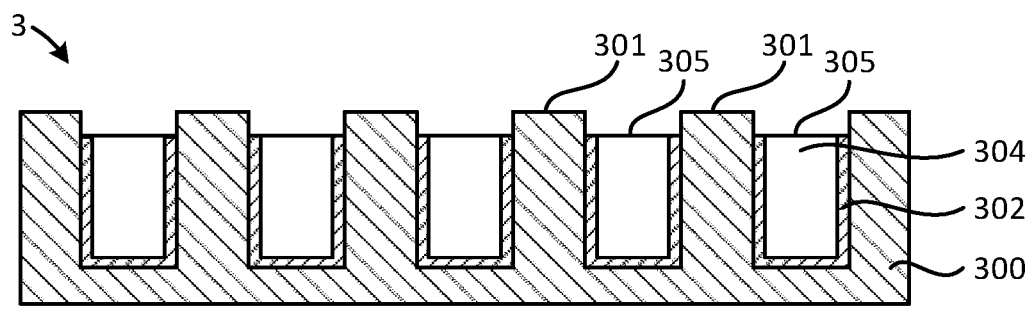

FIG. 3B illustrates a cross-sectional view of the substrate 3 after selectively etching the metal to form a recessed metal surface.

The method further includes, as schematically shown in FIG. 3B, etching the metal 304 and the barrier/liner layer 302 to form a recessed metal surface 305 below the dielectric material surface 301. In certain embodiments, although not illustrated, the etching may etch the metal 304 but not the barrier/liner layer 302. In various embodiments, the etching may be carried out by exposing the substrate 3 to a wet solution that is capable of selectively etching the metal 304 without causing a damage to the dielectric material surface 301. For example, an acid solution may be used for such a solution. In one embodiment, an aqueous citric acid solution may be used. In one embodiment, a wet processing system may be used where the substrate 3 is submerged in the wet solution for a predetermined time. The process time for submerging may be less than 1 min in one embodiment, but in other embodiments, between 1 min and 5 min. Such a wet etch process may be performed while rotating the substrate 3 as a spin process, or as a static process. In one embodiment, the wet etch process temperature may be room temperature. In various embodiments, this etching step may be performed using the spin-coating processing system 100 described referring to FIG. 1. According to one embodiment, the recessed metal surface can be between about 0.3 nm and about 3 nm below the dielectric material surface 301. After submerging the substrate 3 in the wet solution, the substrate 3 may be rinsed and dried to remove any residual solution from the substrate 3. In certain embodiments, the drying step may be performed using the anneal module 112 of the spin-coating processing system 100.

Figure 3C:
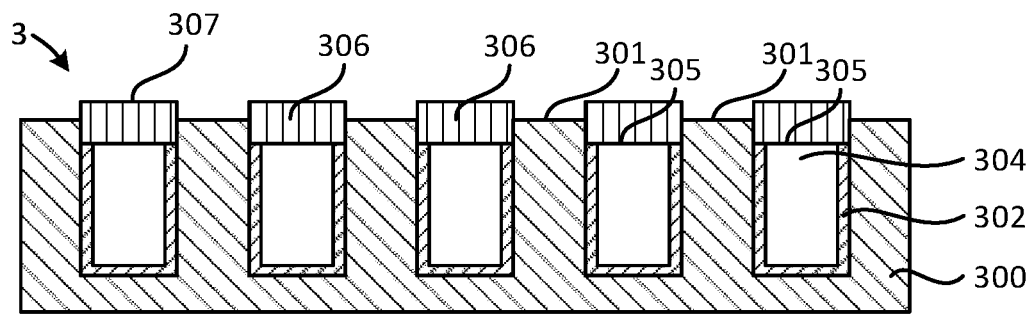

FIG. 3C illustrates a cross-sectional view of the substrate 3 after selectively forming a self-assembled monolayer (SAM) on the recessed metal surface.

The method further includes, as schematically shown in FIG. 3C, selectively forming a self-assembled monolayer (SAM) 306 on the exposed recessed metal surface 305 using a spin-on process. The SAM 306 may be formed using the coating module 104 of the spin-coating processing system 100 described in FIG. 1. The method includes dispensing at least one chemical solution on the substrate 3 while rotating the substrate 3, where the at least one chemical solution includes at least one type of a chemical compound containing a carbon group, a bonding group coupled to the carbon group, and a terminal group coupled to the carbon group that is opposite the bonding group. The at least one chemical solution may further include a solvent, for example an organic solvent. The amount of the at least one chemical solution that is dispensed should enable at least a majority of the substrate 3 to be covered by the at least one chemical solution. In one example, a concentration of the SAM molecule in the at least one chemical solution can be about 5 mM, or less. The substrate 3 may be rotated during the application of the at least one chemical solution, for example at a rotation speed between about 800 rpm and about 2200 rpm. In various embodiments, the spin-on process to deposit the SAM may comprise repeating dispensing the chemical solution to ensure a sufficient packing density of the SAM on the recessed metal surface 305 can be achieved.

According to certain embodiments, the at least one chemical solution includes a first chemical solution and a second chemical solution, where the dispensing includes sequentially dispensing the first chemical solution and the second chemical solution on the substrate 3. In one embodiment, the first chemical solution and the second chemical solution may include different SAM molecules so that the SAM may comprise more than one type of SAM molecules. Such an embodiment may advantageously enable more complete coverage of the exposed metal surface 305 if the metal 304 comprises more than one metal.

In various embodiments, the SAM 306 may have a thickness of less than 1 nm. Accordingly, top surfaces 307 of the SAM 306 may be higher or lower than the dielectric material surface 301, although FIG. 3C illustrates a case where the top surfaces 307 of the SAM 306 is higher. In certain embodiments, the top surfaces 307 of the SAM 306 and the dielectric material surface 301 may be essentially in the same plane.

The bonding group of the SAM molecule contains a reactive element (e.g., a thiol group) that can bond or chemically react with the exposed recessed metal surface 305 of the metal 304, while only weakly interacting with the dielectric material surface 301 of the dielectric material 300. Thereafter, a rinsing solution (e.g., isopropyl alcohol (IPA)) may be dispensed by the coating module 104 on the substrate 3 to remove any excess chemical solution from the substrate 3, including any weakly bound SAM molecules from the dielectric material surface 301 of the dielectric material 300.

Thereafter, the substrate 3 may be removed from the coating module 104 to the anneal module 112 that may include a resistive heating element or a radiation source (e.g., UV light). In the anneal module 112, the substrate 3 may be annealed at a temperature that is below the desorption temperature and the degradation temperature of the SAM on the exposed metal surface 303. In one example, using SAM molecules of 1-octadecanethiol, the substrate 3 may be annealed at a temperature of less than 160° C. (the degradation temperature of 1-octadecanethiol), for a time period of about 5 minutes, or less. In other embodiments, the substrate 3 may be removed from the system 100 and annealed in a separate tool (e.g., bake oven, furnace, etc.). The annealing may enable or improve the self-assembly of the SAM molecules components on the exposed recessed metal surface 305 of the metal 304. Thereafter, the substrate 3 may be transferred to the coating module 104 for additional rinsing, followed by a soft bake in the anneal module 112. The soft bake may be performed at a temperature of less than 160° C. This series of steps selectively forms an ordered SAM 306 on the recessed metal surface 305, while the dielectric material surface 301 remains at least substantially free of the SAM molecules.

According to one embodiment, the sequential steps of dispensing at least one chemical solution on the substrate 3 while rotating the substrate 3, annealing the substrate 3 following the dispensing the at least one chemical solution on the substrate 3, and dispensing a rinsing solution on the substrate 3, may be repeated at least once to improve the coverage and the quality of the SAM 306 on the recessed metal surface 305.

The characteristics of the SAM 306 may include on or more of the following characteristics: uniform thickness distribution on the recessed metal surface 305 across the substrate 3 within the range of the thickness of one monolayer and a uniform water contact angle appropriate to the terminal group of the SAM 306. The SAM 306 can act as a blocking layer for subsequent film deposition and further protects the recessed metal surface 305 against adverse effects such as oxidation and also metal diffusion from the metal 304 into the dielectric material 300. The inventors have realized that recessing the metal 304, and forming the SAM 306 on the recessed metal surface 305 in FIG. 3B instead of on the metal surface 303 in FIG. 3A, reduces or prevents the SAM 306 in FIG. 3C from "mushrooming" or encroaching onto the dielectric material surface 301. Such an encroachment can hinder subsequent deposition of film on the dielectric material surface 301 adjacent the metal 304.

Figure 3D:
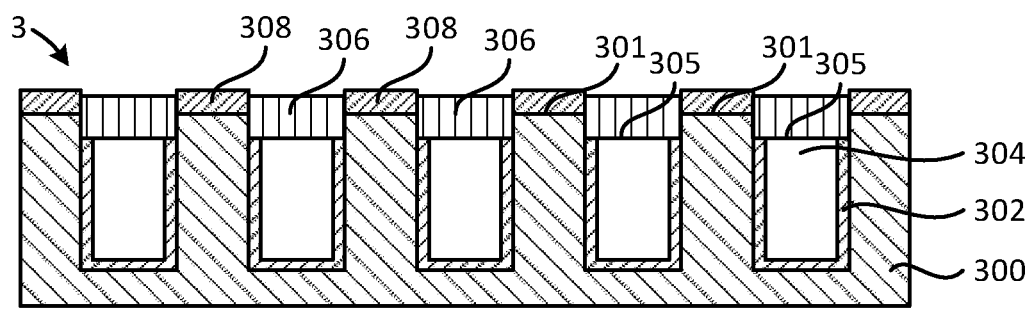

FIG. 3D illustrates a cross-sectional view of the substrate 3 after depositing a dielectric film on the dielectric material surface, where the SAM hinders deposition of the dielectric film on the recessed metal surface.

The method further includes, as schematically shown in FIG. 3D, depositing a dielectric film 308 on the exposed dielectric material surface 301, where the SAM 306 hinders deposition of the dielectric film 308 on the recessed metal surface 305. The dielectric film 308 can include $SiO_2$, a low-k material, or a high-k material, and the depositing can include a gas phase exposure. In various embodiments, the depositing may be performed using a vapor deposition technique such as chemical vapor deposition (CVD), physical vapor deposition (PVD), and atomic layer deposition (ALD), as well as other plasma processes such as plasma enhanced CVD (PECVD), sputtering, and other processes.

According to one embodiment, the depositing includes adsorbing a metal-containing catalyst layer on the dielectric material surface 301, and in the absence of any oxidizing and hydrolyzing agent, at a substrate temperature of approximately 150° C., or less, exposing the substrate to a process gas containing a silanol gas to deposit a $SiO_2$ film. For example, the silanol gas may be selected from the group consisting of tris(tert-pentoxy) silanol, tris(tert-butoxy) silanol, and bis(tert-butoxy)(isopropoxy) silanol. The metal-containing catalyst layer can, for example, include aluminum (Al) or titanium (Ti). In one example, the metal-containing catalyst layer may be formed by exposing the substrate to $AlMe_3$ gas. In one example, the silanol gas is selected from the group consisting of tris(tert-pentoxy) silanol, tris(tert-butoxy) silanol, and bis(tert-butoxy)(isopropoxy) silanol.

Figure 3E:
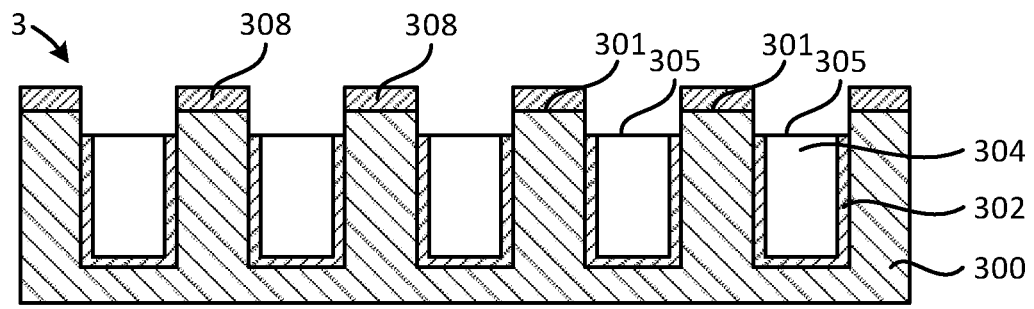

FIG. 3E illustrates a cross-sectional view of the substrate 3 after removing the SAM.

In one example, following deposition of the dielectric film 308, the substrate 3 may be transferred to the anneal module 112 and annealed at a temperature that results in desorption of the SAM 306 from the substrate 3 to restore the recessed metal surface 305 before further processing. The resulting substrate 3 is schematically shown in FIG. 3E. In another example, the substrate 3 may be transferred to another processing system or to another processing platform where the SAM 306 may be removed. Alternatively, the SAM 306 may be removed using a gaseous exposure to plasma-excited $H_2$ gas and optional substrate heating. In addition to removing the SAM 306, a gaseous exposure to plasma-excited $H_2$ gas may further clean the dielectric film 308.

According to one embodiment, the formation of the dielectric film 308 on the dielectric material surface 301 may be used for forming a fully self-aligned via (FSAV) over the metal 304.

According to one embodiment, deposition of the dielectric film 308 further deposits an unwanted additional dielectric film (not shown) on the recessed metal surface 305 due to imperfections in the coverage of the SAM 306. In one example, the additional dielectric film can form an overhang over the recessed metal surface 305. In order to address this unwanted deposition, the method can further include removing or shaping (trimming) the additional dielectric film from the recessed metal surface 305 to improve the selectivity of the formation of the dielectric film 308 on the dielectric material surface 301 and not on the recessed metal surface 305. In one example, atomic layer etching (ALE) using sequential gaseous exposures of HF and $Al(CH_3)_3$ may be used to etch an additional dielectric film containing $SiO_2$.

Figure 4A:
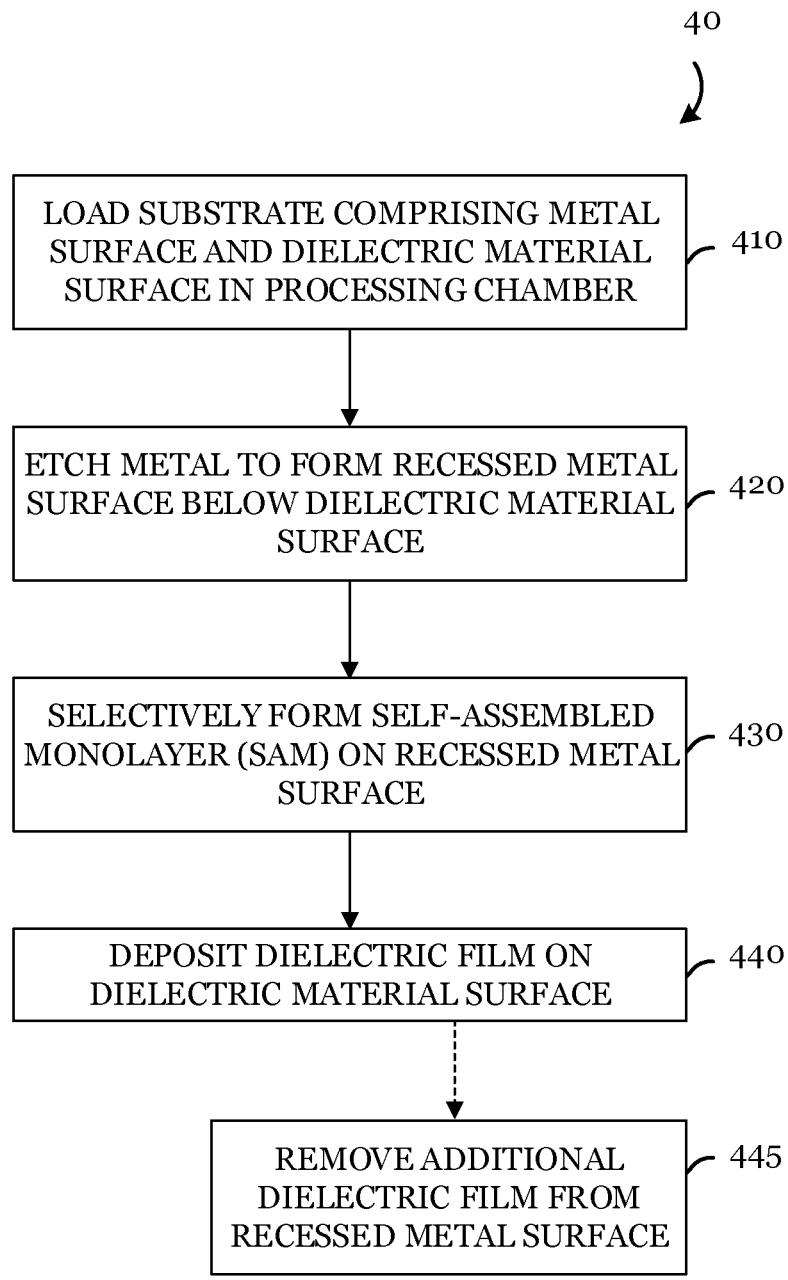
Figure 4B:
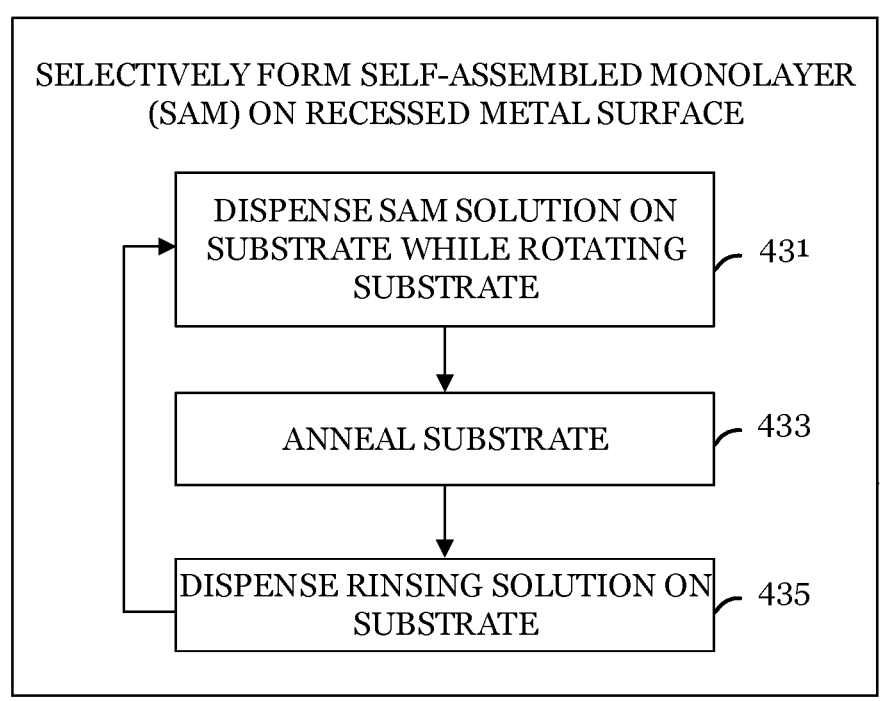
Figure 4C:
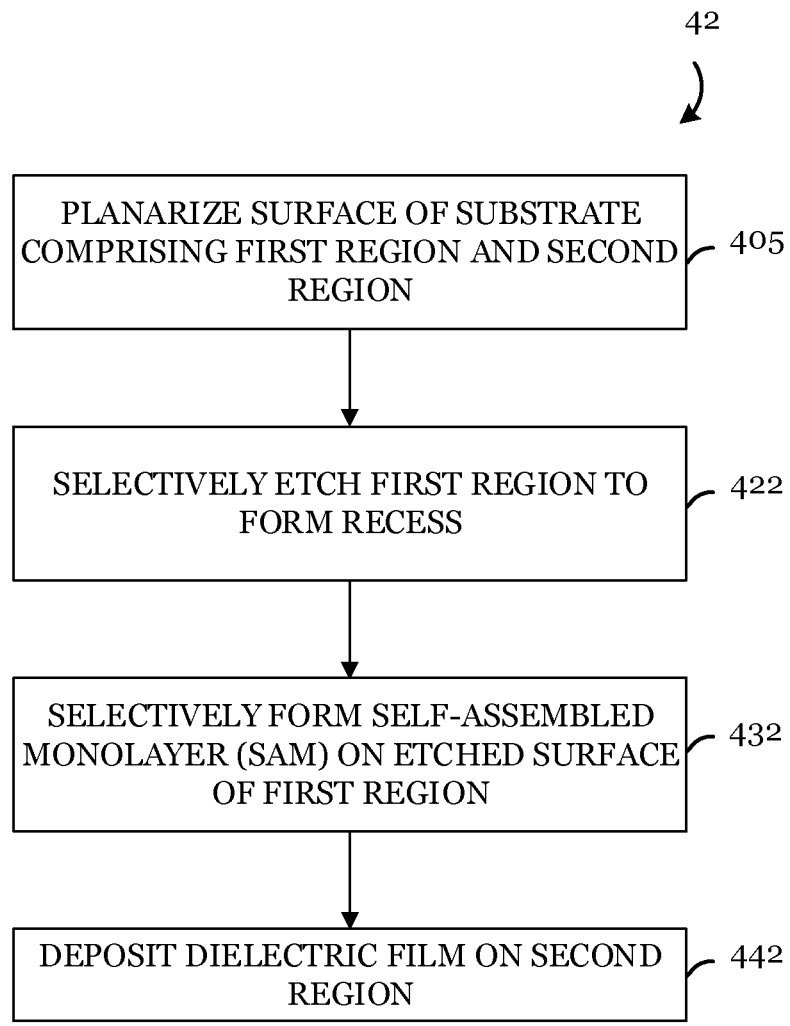
Figure 4D:
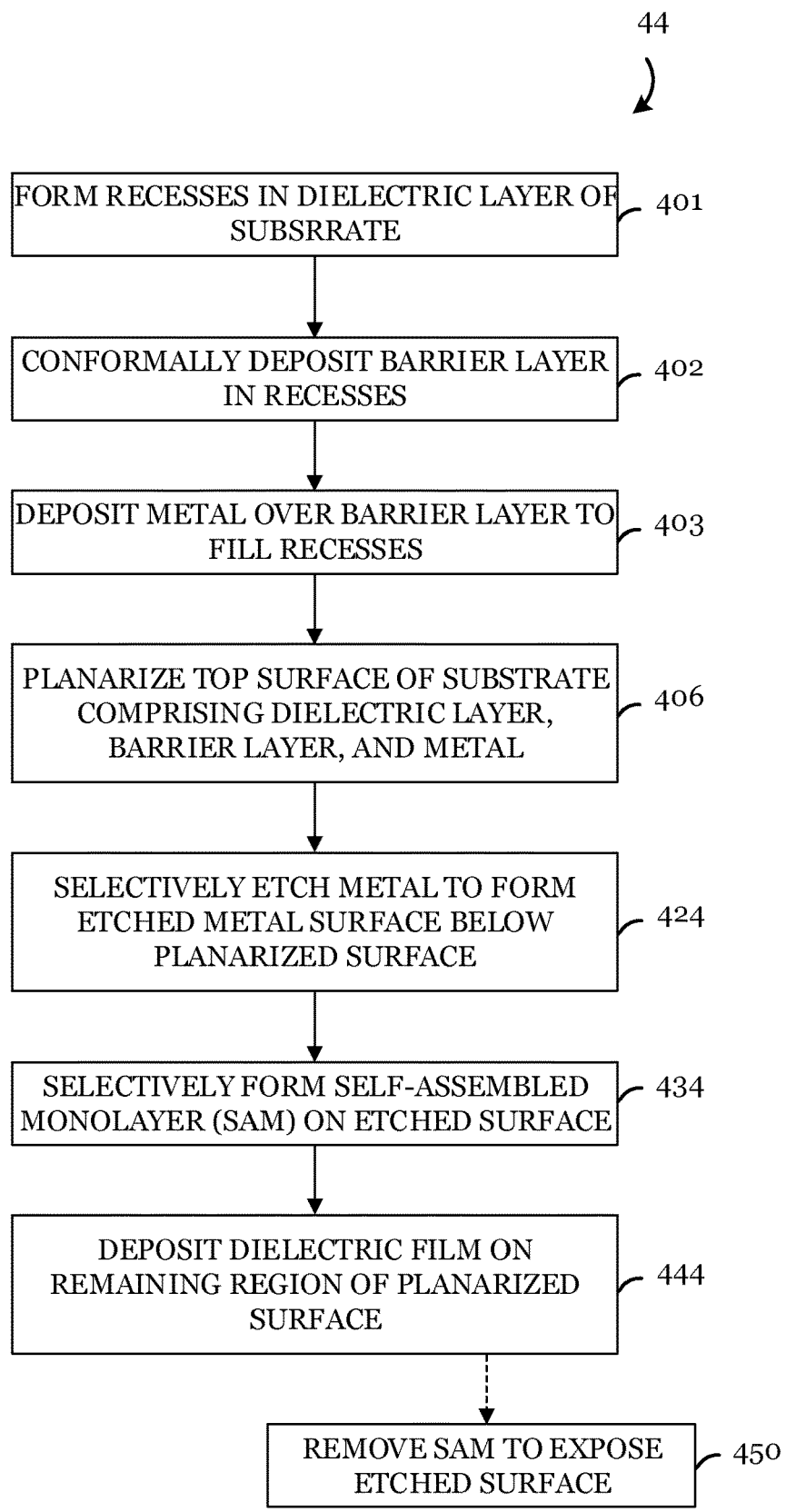

FIG. 4A-4D illustrate example process flow diagrams in accordance with various embodiments, wherein FIG. 4A illustrates an embodiment, FIG. 4B illustrates steps for selectively forming a SAM on a recessed metal surface in accordance with an embodiment, FIG. 4C illustrates another embodiment, and FIG. 4D illustrates yet another embodiment. The process flows can be followed with the figures (FIG. 3A-3E) discussed above and hence will not be described again.

In FIG. 4A, a process flow 4o starts with loading a substrate comprising a metal surface and a dielectric material surface in a processing chamber (block 410, FIG. 3A). Next, the metal surface is selectively etched to form a recessed metal surface below the dielectric material surface (block 42o, FIG. 3B). Subsequently, a selective formation of a self-assembled monolayer (SAM) is performed using a spin-on process, where the SAM is deposited selectively on the recessed metal surface (block 430, FIG. 3C). A dielectric film may then be deposited on the dielectric material surface, wherein the SAM hinders deposition of the dielectric film over the recessed metal surface (block 440, FIG. 3D). In certain embodiments, when an additional dielectric film is deposited non-selectively on the recessed metal surface, an optional removal step to remove the additional dielectric film may be performed (block 445).

In FIG. 4B, in accordance with an embodiment, a spin-on process 430 (e.g., FIG. 4A) for selectively forming a SAM is illustrated. The spin-on process 430 may start with dispensing a solution comprising SAM molecules on a substrate while rotating the substrate (block 431). After the dispensing, the substrate may be annealed (block 432), followed by dispensing a rinsing solution on the substrate to remove any non-adsorbed SAM molecules (block 435). In certain embodiments, the above steps may be repeated to improve the coverage and the quality of the SAM. In one or more embodiments, when repeating the above steps, one or more chemical solutions may be utilized to enable using more than one type of SAM molecule.

In FIG. 4C, a process flow 42 starts with planarizing a surface of a substrate comprising a first material and a second material and exposing a first region comprising the first material and a second region comprising the second material (block 405, FIG. 3A). Next, a recess is formed by selectively etching the first region (block 422, FIG. 3B). Subsequently, a self-assembled monolayer (SAM) is selectively formed on the etched surface of the first region using a spin-on process (block 432, FIG. 3C), followed by depositing a dielectric film on the second region of the planarized surface, wherein the SAM hinders deposition of the dielectric film over the first region (block 442, FIG. 3D).

In FIG. 4D, a process flow 44 starts with forming a first plurality of recesses in a dielectric layer of a substrate (block 401), conformally depositing a barrier layer within the plurality of recesses (block 402), depositing a metal over the barrier layer to fill the first plurality of recesses (block 403), and planarizing a top surface of the substrate (block 406, FIG. 3A). Next, the metal is selectively etched to form an etched surface at a lower level than a remaining region of the planarized surface (block 424, FIG. 3B). A SAM is then formed selectively on the etched surface using a spin-on process (block 434, FIG. 3C), followed by depositing a dielectric film on the remaining region of the planarized surface, wherein the SAM hinders deposition of the dielectric film over the etched surface (block 444, FIG. 3D). In certain embodiments, after depositing the dielectric film, the process flow 44 may continue to removing the SAM to expose the etched surface (block 450, FIG. 3E).

Example embodiments are summarized here. Other embodiments can also be understood from the entirety of the specification as well as the claims filed herein.

Example 1. A method of processing a substrate that includes: loading the substrate in a processing system, the substrate including a metal having a metal surface and a first dielectric material having a dielectric material surface, the metal surface and the dielectric material surface being at the same level; etching the metal to form a recessed metal surface below the dielectric material surface; selectively forming a self-assembled monolayer (SAM) on the recessed metal surface using a spin-on process; and depositing a dielectric film including a second dielectric material on the dielectric material surface.

Example 2. The method of example 1, where the depositing further deposits an additional dielectric film on the recessed metal surface, the method further including: removing the additional dielectric film from the recessed metal surface to selectively form the dielectric film on the dielectric material surface and not on the recessed metal surface.

Example 3. The method of one of examples 1 or 2, where the etching the metal includes exposing the substrate to a wet solution.

Example 4. The method of one of examples 1 to 3, where the wet solution includes a citric acid solution.

Example 5. The method of one of examples 1 to 4, where the recessed metal surface is between about 0.3 nm and about 3 nm below the dielectric material surface.

Example 6. The method of one of examples 1 to 5, where the selectively forming the SAM includes: dispensing a solution including SAM molecules on the substrate while rotating the substrate, the SAM molecules including a carbon group, a bonding group coupled to the carbon group, a terminal group coupled to the carbon group that is opposite the bonding group; annealing the substrate; and dispensing a rinsing solution on the substrate.

Example 7. The method of one of examples 1 to 6, where the bonding group includes a thiol, a silane, or a phosphonate.

Example 8. The method of one of examples 1 to 7, where the SAM is formed from SAM molecules including i-octadecanethiol ($CH_3(CH_2)_{16}CH_2SH$), perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), or tertbutyl(chloro)dimethylsilane ($(CH_3)_3CSi(Cl)(CH_3)_2$)).

Example 9. The method of one of examples 1 to 8, where the first dielectric material includes $SiO_2$ or a low-k material.

Example 10. The method of one of examples 1 to 9, where the second dielectric includes $SiO_2$, a low-k material, or a high-k material.

Example 11. A method of processing a substrate that includes: planarizing a surface of the substrate, the substrate including a first material and a second material, the planarizing exposing a first region including the first material and a second region including the second material; selectively etching the first region to form a recess, the recess having an etched surface at a lower level than the second region of the planarized surface; selectively forming a self-assembled monolayer (SAM) on the etched surface of the first region using a spin-on process; and depositing a dielectric film on the second region of the planarized surface.

Example 12. The method of 11, where the planarizing includes a chemical mechanical planarization process.

Example 13. The method of 11, where the first material includes Cu, Al, Ta, Ti, W, Ru, Co, Ni, or Mo, and the second material includes Si.

Example 14. The method of one of examples 11 to 13, where the depositing the dielectric film includes a gas phase exposure.

Example 15. The method of one of examples 11 to 14, where the depositing the dielectric film includes: adsorbing a metal-containing catalyst layer on the second region of the planarized surface; and in the absence of any oxidizing and hydrolyzing agent, at a substrate temperature of approximately 150° C., or less, exposing the substrate to a process gas containing a silanol gas to deposit a $SiO_2$ film.

Example 16. The method of one of examples 11 to 15, where the silanol gas is selected from the group consisting of tris(tert-pentoxy) silanol, tris(tert-butoxy) silanol, and bis(tert-butoxy)(isopropoxy) silanol.

Example 17. A method of processing a substrate that includes: forming a first plurality of recesses in a dielectric layer of the substrate, the dielectric layer including a first dielectric material; conformally depositing a barrier layer within the plurality of recesses; depositing a metal over the barrier layer to fill the first plurality of recesses; planarizing a top surface of the substrate, the planarized surface including the first dielectric material, the barrier layer, and the metal; selectively etching the metal to form an etched surface at a lower level than a remaining region of the planarized surface; selectively forming a self-assembled monolayer (SAM) on the etched surface using a spin-on process; and depositing a dielectric film on the remaining region of the planarized surface.

Example 18. The method of example 17, where the plurality of recesses has a pitch size of 30 nm or less.

Example 19. The method of one of examples 17 or 18, further including, after depositing the dielectric film, removing the SAM to expose the etched surface.

Example 20. The method of one of examples 17 to 19, where the removing includes exposing the substrate to a hydrogen-containing plasma.

A plurality of embodiments for selective film formation using self-assembled monolayers have been described. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
    loading the substrate in a processing system, the substrate comprising a metal having a metal surface and a first dielectric material having a dielectric material surface, the metal surface and the dielectric material surface being at the same level;
    etching the metal to form a recessed metal surface below the dielectric material surface;
    selectively forming a self-assembled monolayer (SAM) on the recessed metal surface using a spin-on process;

depositing a dielectric film comprising a second dielectric material on the dielectric material surface, wherein the depositing further deposits an additional dielectric film on the recessed metal surface; and removing the additional dielectric film from the recessed metal surface to selectively form the dielectric film on the dielectric material surface and not on the recessed metal surface.

2. The method of claim 1, wherein the etching the metal comprises exposing the substrate to a wet solution.

3. The method of claim 2, wherein the wet solution comprises a citric acid solution.

4. The method of claim 1, wherein the recessed metal surface is between about 0.3 nm and about 3 nm below the dielectric material surface.

5. The method of claim 1, wherein the selectively forming the SAM comprises:

dispensing a solution comprising SAM molecules on the substrate while rotating the substrate, the SAM molecules comprising a carbon group, a bonding group coupled to the carbon group, a terminal group coupled to the carbon group that is opposite the bonding group;

annealing the substrate; and dispensing a rinsing solution on the substrate.

6. The method of claim 5, wherein the bonding group comprises a thiol, a silane, or a phosphonate.

7. The method of claim 1, wherein the SAM is formed from SAM molecules comprising 1-octadecanethiol (CH3(CH2)16CH2SH), perfluorodecyltrichlorosilane (CF3(CF2)7CH2CH2SiCl3), perfluorodecanethiol (CF3(CF2)7CH2CH2SH), chlorodecyldimethylsilane (CH3(CH2)8CH2Si(CH3)2Cl), or tertbutyl(chloro)dimethylsilane ((CH3)3CSi(Cl)(CH3)2)).

8. The method of claim 1, wherein the first dielectric material comprises SiO2 or a low-k material.

9. The method of claim 1, wherein the second dielectric material comprises SiO2, a low-k material, or a high-k material.

10. A method of processing a substrate, the method comprising:

planarizing a surface of the substrate, the substrate comprising a first material and a second material, the planarizing exposing a first region comprising the first material and a second region comprising the second material;

selectively etching the first region to form a recess, the recess having an etched surface at a lower level than the second region of the planarized surface;

selectively forming a self-assembled monolayer (SAM) on the etched surface of the first region using a spin-on process; and depositing a dielectric film on the second region of the planarized surface, wherein the depositing the dielectric film comprises:

adsorbing a metal-containing catalyst layer on the second region of the planarized surface; and in the absence of any oxidizing and hydrolyzing agent, at a substrate temperature of approximately 150° C., or less, exposing the substrate to a process gas containing a silanol gas to deposit a SiO2 film.

11. The method of 10, wherein the planarizing comprises a chemical mechanical planarization process.

12. The method of 10, wherein the first material comprises Cu, Al, Ta, Ti, W, Ru, Co, Ni, or Mo, and the second material comprises Si.

13. The method of claim 10, wherein the depositing the dielectric film includes a gas phase exposure.

14. The method of claim 10, wherein the silanol gas is selected from the group consisting of tris(tert-pentoxy) silanol, tris(tert-butoxy) silanol, and bis(tert-butoxy)(isopropoxy) silanol.

15. The method of claim 10, wherein the SAM is formed from SAM molecules comprising 1-octadecanethiol (CH3(CH2)16CH2SH), perfluorodecyltrichlorosilane (CF3(CF2)7CH2CH2SiC13), perfluorodecanethiol (CF3(CF2)7CH2CH2SH), chlorodecyldimethylsilane (CH3(CH2)8CH2Si(CH3)2Cl), or tertbutyl(chloro)dimethylsilane ((CH3)3CSi(Cl)(CH3)2)).

16. A method of processing a substrate, the method comprising:

forming a first plurality of recesses in a dielectric layer of the substrate, the dielectric layer comprising a first dielectric material;

conformally depositing a barrier layer within the first plurality of recesses;

depositing a metal over the barrier layer to fill the first plurality of recesses;

planarizing a top surface of the substrate, the planarized top surface comprising the first dielectric material, the barrier layer, and the metal;

selectively etching the metal to form an etched surface at a lower level than a remaining region of the planarized top surface;

selectively forming a self-assembled monolayer (SAM) on the etched surface using a spin-on process;

depositing a dielectric film on the remaining region of the planarized top surface; and after depositing the dielectric film, removing the SAM to expose the etched surface, wherein the removing comprises exposing the substrate to a hydrogen-containing plasma.

17. The method of claim 16, wherein the first plurality of recesses has a pitch size of 30 nm or less.

18. The method of claim 16, wherein the SAM is formed from SAM molecules comprising 1-octadecanethiol (CH3(CH2)16CH2SH), perfluorodecyltrichlorosilane (CF3(CF2)7CH2CH2SiC13), perfluorodecanethiol (CF3(CF2)7CH2CH2SH), chlorodecyldimethylsilane (CH3(CH2)8CH2Si(CH3)2Cl), or tertbutyl(chloro)dimethylsilane ((CH3)3CSi(Cl)(CH3)2)).

19. The method of claim 16, wherein the selectively etching the metal comprises exposing the substrate to a wet solution, wherein the wet solution comprises a citric acid solution.

20. The method of claim 16, wherein the etched surface at a lower level is between about 0.3 nm and about 3 nm below the remaining region of the planarized top surface.

* * * * *